United States Patent
De Lind Van Wijngaarden et al.

(10) Patent No.: US 8,892,983 B2
(45) Date of Patent: Nov. 18, 2014

(54) METHOD AND APPARATUS FOR ERROR DETECTION IN A COMMUNICATION SYSTEM

(75) Inventors: Adriaan J. De Lind Van Wijngaarden, New Providence, NJ (US); Andreas Bernhard Zottmann, Lauf (DE)

(73) Assignee: Alcatel Lucent, Boulogne-Billancourt (FR)

( * ) Notice: Subject to any disclaimer, the term of this patent is extended or adjusted under 35 U.S.C. 154(b) by 976 days.

(21) Appl. No.: 12/612,674

(22) Filed: Nov. 4, 2009

(65) Prior Publication Data

US 2010/0153828 A1 Jun. 17, 2010

Related U.S. Application Data

(60) Provisional application No. 61/198,309, filed on Nov. 4, 2008.

(51) Int. Cl.
*H03M 13/09* (2006.01)
*H04L 1/00* (2006.01)
*H03M 13/00* (2006.01)

(52) U.S. Cl.
CPC ............. *H03M 13/09* (2013.01); *H04L 1/0041* (2013.01); *H03M 13/611* (2013.01); *H04L 1/0084* (2013.01); *H03M 13/6527* (2013.01)
USPC ........................................................ 714/776

(58) Field of Classification Search
USPC ........................................................ 714/776
See application file for complete search history.

(56) References Cited

U.S. PATENT DOCUMENTS 5,473,607 A * 12/1995 Hausman et al. ............. 370/392
6,519,737 B1 2/2003 Derby
(Continued)

FOREIGN PATENT DOCUMENTS

CN 1509520 A 6/2004
EP 0 552 861 A2 7/1993
(Continued)

OTHER PUBLICATIONS

PCT International Search Report, PCT/US2010/055391, International filing date Nov. 4, 2011, Date of mailing of the International Search Report Jul. 18, 2011.

(Continued)

*Primary Examiner* — Amine Riad
(74) *Attorney, Agent, or Firm* — J. F. McCabe

(57) ABSTRACT

A method processes a data packet in a first sequence of disjoint original segments of the same length. The method includes modifying a first of the original segments of the first sequence by modifying one or more symbols therein. A start of the data packet is located in the first of the original segments and is positioned after a first digital data symbol therein. The method also includes modifying a last of the original segments of the first sequence by modifying one or more digital data symbols therein. An end of the data packet is located in the last of the original segments and is located before the last digital data symbol therein. The method also includes determining a remainder sequence by effectively performing a polynomial division on a second sequence of disjoint segments that are derived from the first sequence. Each segment of the second sequence corresponds to and is derived from one of the original segments of the first sequence. The segments of the second sequence have the length of the original segments of the first sequence. A first of the derived segments of the second sequence is the modified first of the original segments. A last of the derived segments of the second sequence is derived from the modified last of the original segments.

14 Claims, 10 Drawing Sheets

(56) References Cited

U.S. PATENT DOCUMENTS

| | | | |
|---|---|---|---|
| 6,665,834 B2* | 12/2003 | Irvin et al. | 714/811 |
| 7,185,266 B2* | 2/2007 | Blightman et al. | 714/776 |
| 7,243,289 B1* | 7/2007 | Madhusudhana et al. | 714/758 |
| 7,471,622 B2* | 12/2008 | You et al. | 370/209 |
| 7,530,007 B2* | 5/2009 | Touzni et al. | 714/776 |
| 7,543,214 B2* | 6/2009 | Ricci | 714/758 |
| 7,546,511 B2* | 6/2009 | You et al. | 714/758 |
| 8,108,753 B2* | 1/2012 | Anderson et al. | 714/758 |
| 8,429,504 B2* | 4/2013 | Lee et al. | 714/776 |
| 8,458,570 B2* | 6/2013 | Marin et al. | 714/776 |
| 8,489,968 B2* | 7/2013 | Marin et al. | 714/776 |
| 8,495,477 B2* | 7/2013 | Song et al. | 714/784 |
| 8,522,117 B2* | 8/2013 | Hassan et al. | 714/776 |
| 2002/0170013 A1 | 11/2002 | Bolourchi et al. | |
| 2003/0223417 A1* | 12/2003 | Higashida | 370/389 |
| 2006/0242535 A1 | 10/2006 | Barthel et al. | |
| 2008/0052603 A1 | 2/2008 | Wiatrowski et al. | |
| 2009/0119568 A1 | 5/2009 | Shen et al. | |
| 2009/0223417 A1* | 9/2009 | Muirhead | 108/13 |
| 2013/0007567 A1* | 1/2013 | Singh et al. | 714/774 |

FOREIGN PATENT DOCUMENTS

| | | |
|---|---|---|
| GB | 2 360 177 A | 9/2001 |
| JP | 06-021920 | 1/1994 |
| JP | 6-21920 | 1/1994 |
| WO | WO 2009/036004 A2 | 3/2009 |
| WO | WO 2009/038313 A1 | 3/2009 |

OTHER PUBLICATIONS

Bernard Sklar, "Digital Communications Fundamentals and Applications", PTR Prentiss Hall, Englewood Cliffs, New Jersey 07632, 1988, Title page, Copyright page, vii-xix, pp. 245-380 and 595-667.
Gary B. Shelly et al., "Business Data Communications Introductory Concepts and Techniques", Fourth Edition, Course Technology, Boston MA 02210, 2004, Title page, Copyright page, iii-ix, pp. 5.1-5.30 and 6.1-6.35.
Supplementary European Search Report, EP 10 82 9067, Mar. 21, 2013, 3 pgs.
IEEE Standard 802.3-2005, 2005, "Part 3: Carrier Sense Multiple Access with Collision Detection (CSMA/CD) Access Method and Physical Layer Specifications", Section One, Title page, pp. i-xxxii and pp. 1-594.
IEEE Standard 802.3-2005, 2005, "Part 3: Carrier Sense Multiple Access with Collision Detection (CSMA/CD) Access Method and Physical Layer Specifications", Section Two, pp. 1-810.
IEEE Standard 802.3-2005, 2005, "Part 3: Carrier Sense Multiple Access with Collision Detection (CSMA/CD) Access Method and Physical Layer Specifications", Section Three, pp. 1-387.
IEEE Standard 802.3-2005, 2005, "Part 3: Carrier Sense Multiple Access with Collision Detection (CSMA/CD) Access Method and Physical Layer Specifications", Section Four, pp. 1-454.
IEEE Standard 802.3-2005, 2005, "Part 3: Carrier Sense Multiple Access with Collision Detection (CSMA/CD) Access Method and Physical Layer Specifications", Section Five, pp. 1-417.
IEEE Standard 802.3-2008, 2008, "Part 3: Carrier Sense Multiple Access with Collision Detection (CSMA/CD) Access Method and Physical Layer Specifications", Section One, Title page, pp. i-lxxi and pp. 1-597.
IEEE Standard 802.3-2008, 2008, "Part 3: Carrier Sense Multiple Access with Collision Detection (CSMA/CD) Access Method and Physical Layer Specifications", Section Two, pp. 1-790.
IEEE Standard 802.3-2008, 2008, "Part 3: Carrier Sense Multiple Access with Collision Detection (CSMA/CD) Access Method and Physical Layer Specifications", Section Three, pp. 1-315.
IEEE Standard 802.3-2008, 2008, "Part 3: Carrier Sense Multiple Access with Collision Detection (CSMA/CD) Access Method and Physical Layer Specifications", Section Four, pp. 1-586.
IEEE Standard 802.3-2008, 2008, "Part 3: Carrier Sense Multiple Access with Collision Detection (CSMA/CD) Access Method and Physical Layer Specifications", Section Five, pp. 1-615.

* cited by examiner

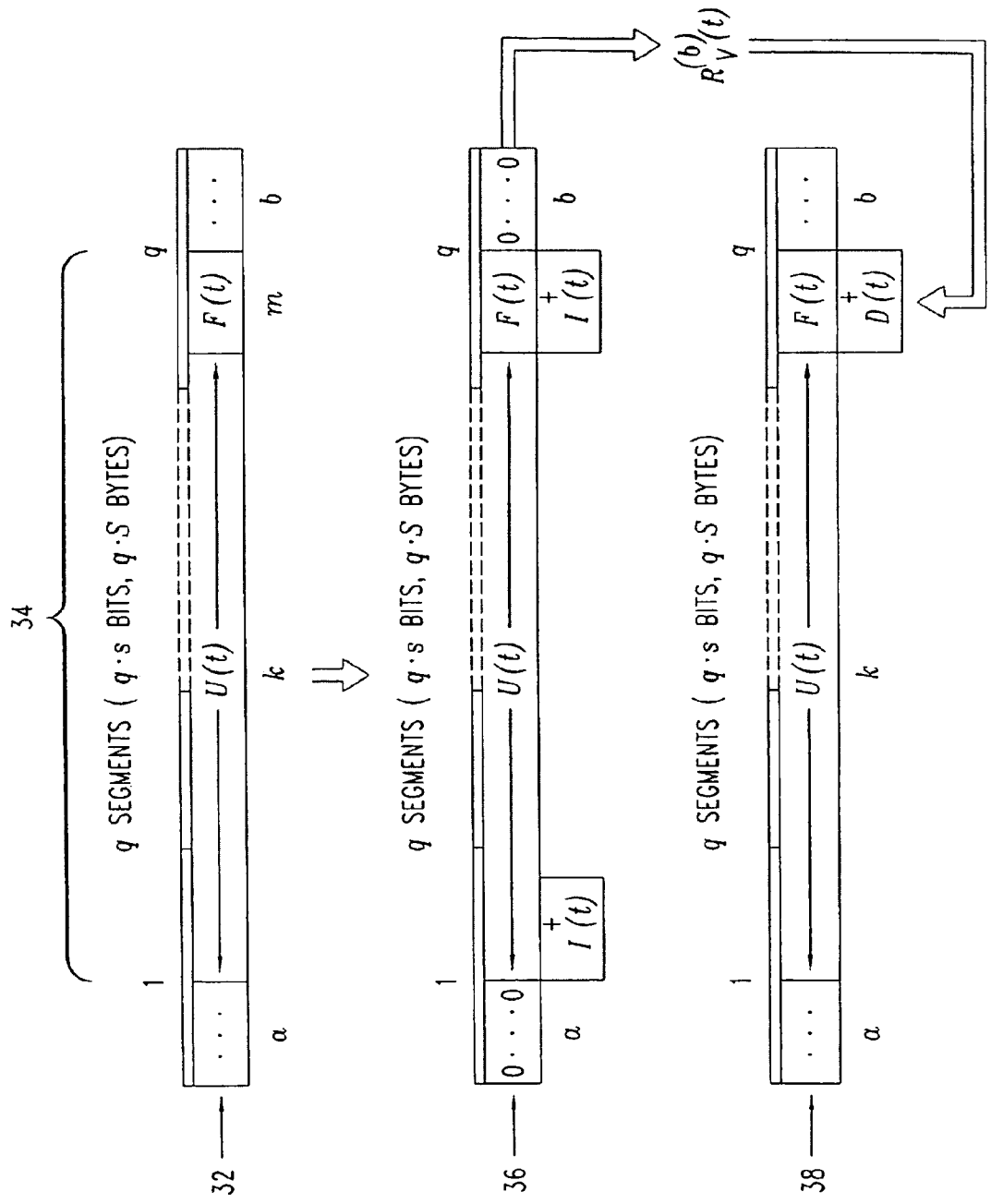

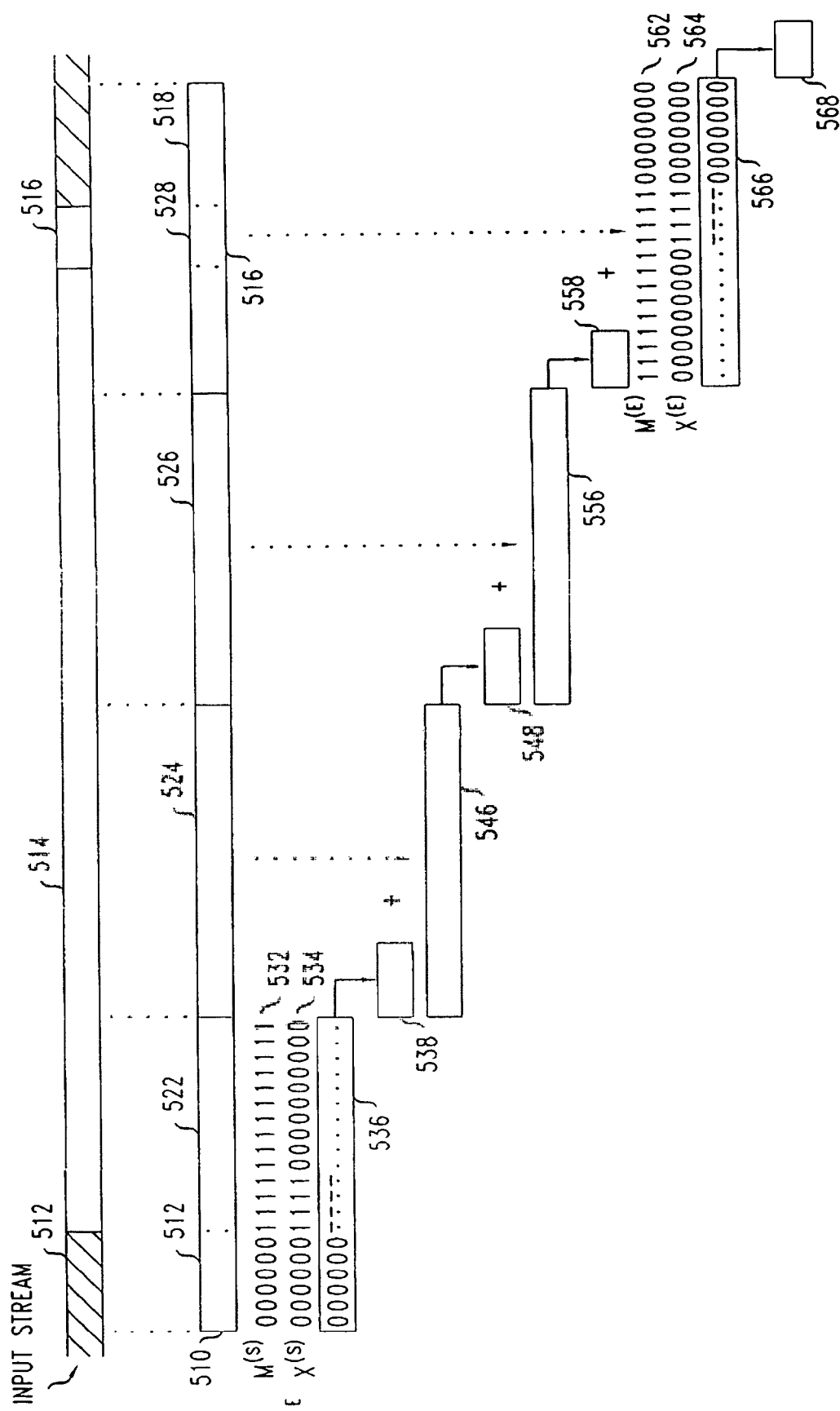

METHOD AND APPARATUS FOR ERROR DETECTION IN A COMMUNICATION SYSTEM

This application claims the benefit of U.S. provisional patent application No. 61/198,309, filed Nov. 4, 2008.

BACKGROUND

1. Field of the Invention

This invention relates to detecting transmission related errors in a packet-based communication system.

2. Discussion of Art

This section introduces various aspects that may aid the reader in obtaining a better understanding of various aspects of the inventions and should not be understood to include statements about what is prior art or what is not prior art.

One goal of communication systems is to ensure that messages received by intended recipients are unaltered copies of the transmitted messages. For that reason, communication systems often employ error detection techniques that enable a recipient to determine whether a received message was altered during transmission. One technique for detecting channel-induced message errors is based on a cyclic redundancy check (CRC) code. A CRC code typically transforms a sequence of digital data symbols, e.g., representing a data message, to produce a sequence of digital check symbols. The sequence of digital check symbols is transmitted with the sequence of digital data symbols and a recipient uses the sequence of digital check symbols to evaluate whether the received sequence of digital data symbols is the same sequence that was originally transmitted.

Some systems generate such a sequence of digital check symbols and detect transmission errors from the transmitted sequence of digital check symbols by using a feedback shift register. For example, a binary CRC code can be implemented with a shift register that is controlled by feedback via exclusive-OR (XOR) logic. The contents of memory elements of the shift register typically correspond to a remainder sequence that is produced by the division of the sequence of digital data symbols by a fixed generator polynomial. The remainder sequence is typically appended to the end of the sequence of digital data symbols for transmission to recipients of the data packet. In such systems, the remainder sequence is typically serially computed on a bit-by-bit basis prior to transmission of the data packet.

SUMMARY

One embodiment includes a method of processing a data packet that is located in a first sequence of disjoint original segments. Each original segment of the first sequence has the same length. The method includes modifying a first of the original segments of the first sequence by modifying one or more symbols therein. A start of the data packet is located in the first of the original segments and is positioned after a first digital data symbol therein. The method also includes modifying a last of the original segments of the first sequence by modifying one or more digital data symbols therein. An end of the data packet is located in the last of the original segments and is located before the last digital data symbol therein. The method also includes determining a remainder sequence by effectively performing a polynomial division on a second sequence of disjoint segments that are derived from the first sequence. Each segment of the second sequence corresponds to and is derived from one of the original segments of the first sequence. The segments of the second sequence have the length of the original segments of the first sequence. A first of the derived segments of the second sequence is the modified first of the original segments. A last of the derived segments of the second sequence is derived from the modified last of the original segments.

BRIEF DESCRIPTION OF THE DRAWINGS

Advantages of various embodiments may become apparent upon reading the following detailed description and upon reference to the drawings in which:

FIG. 1B schematically illustrates methods of processing a sequence of digital data symbols to produce a final sequence for a CRC codeword, e.g., in the data communication system as illustrated in FIG. 1A;

FIG. 5 illustrates processing of an example data packet by one specific embodiment of the methods of FIGS. 1B, 2, and 3, e.g., in the encoder illustrated in FIG. 4A and/or the decoder illustrated in FIG. 4B;

DETAILED DESCRIPTION

Various embodiments relate to apparatus, systems, and methods for use in systems that detect transmission errors in digital data packet-based communication systems.

Figure 1A:
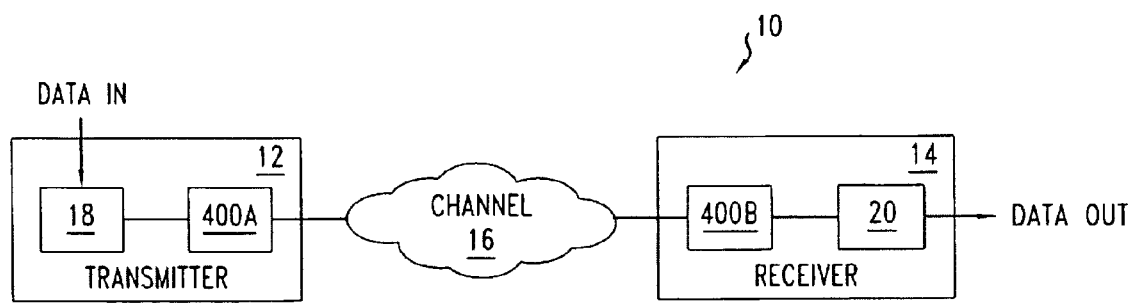
FIG. 1A schematically illustrates a digital data communications system that uses a CRC code for the detection of errors, e.g., errors produced by transmitting digital data packets over a physical communication channel.

FIG. 1A illustrates one example of a communication system 10 that transmits information in digital data packets. The communication system 10 includes a transmitter 12, a receiver 14, and a physical communication channel 16 connecting the transmitter 12 to the receiver 14. The transmitter 12 includes an input data processor 18 and an encoder 400A. The data processor 18 receives data for transmission and produces therefrom a stream of data digital packets. Each digital data packet may have, e.g., a header, a message portion, and a reserved portion. The encoder 400A inserts a CRC check sequence in the reserved portions of one or more of the data packets prior to their transmission to the physical communication channel 16. The receiver 14 includes a decoder 400B and an output data processor 20. The decoder 400B checks the received data packets for transmission errors, i.e., based on the CRC check sequences therein, and indicates the data packets found to have an error to the output data processor 20. The output data processor 20 may extract data from the message portions of the data packets that were found to be error-free by the decoder 400B. The receiver 14 may be configured to signal the transmitter 12 to re-transmit data packets found by the decoder 400B to have transmission errors. The physical communication channel 16 supports data communication between the transmitter 12 and the receiver 14. The physical communication channel 16 may include one or more conventional optical fiber transmission lines, wireless transmission media, and/or wire transmission media, or a combination thereof. The communication system 10 may be configured to provide additional packaging of data packets and/or overhead for other methods of error detection and/or correction, e.g., in addition to CRC check sequence-based methods.

FIG. 1B schematically illustrates methods of processing streams of digital data symbols in a communication system that use a binary CRC code to detect data transmission errors, e.g., steps of the method may be performed in the transmitter 12 and/or receiver 14 of FIG. 1A.

The method involves operating on a first sequence 32 that includes a total of (a+k+m+b) digital data symbols. The first sequence 32 is formed of consecutive segments of equal length. The first sequence 32 includes a sequence 34 of length (k+m) that forms the message and reserved portions of a data packet-of-interest. The message portion is faithfully represented by a polynomial U(t), and the reserved portion is faithfully represented by a polynomial F(t). In the first sequence, the message portion is preceded by a sequence of "a" data symbols, and the reserved portion is followed by a sequence of "b" data symbols.

The method includes masking the first sequence 32 to produce a second sequence 36 that is faithfully represented by a polynomial V(t). In a first embodiment, the masking produces the second sequence 36 by setting to zero those bits of the first sequence 32 that are not located in the message or reserved portions of the data packet. In an alternate second embodiment, the masking produces the second sequence 36 by performing the masking step of the first embodiment and also forming ones complements of the first "m" bits of the message portion and the "m" bits of the reserved portion in the first sequence 32. In FIG. 1B, the two embodiments are indicated schematically by showing an insertion of "+I(t)" under appropriate bit locations of the data packet, i.e., to illustrate the extra masking operation of the second embodiment.

The method includes computing a value of a remainder sequence from the division of the masked second sequence 36 by the sequence that corresponds to the CRC generator polynomial G(t). The remainder is a sequence that is faithfully represented by a polynomial $R^{(b)}{}_V(t)$. At the receiver, the computed value of the remainder sequence is indicative of the absence or presence of some types of data transmission errors in the received data packet.

In embodiments for encoding, the method includes producing a third sequence 38 that will be transmitted from the transmitter to the receiver. The third sequence 38 is formed by replacing the reserved portion 40 of the data packet by a CRC check sequence (in the above-described first embodiment) or a ones complement of such a CRC check sequence (in the above-described first embodiment). Herein, the CRC check sequence or ones complement thereof are represented by a polynomial "F(t)+D(t)" where the polynomial F(t) faithfully represents the original sequence in the reserved portion in the first sequence 32 and D(t) represents the adjustment sequence that causes 34 to become a codeword. Below, steps illustrated in FIG. 1B and notations therein are described in more detail.

Herein, a data packet contains disjoint message and reserved portions, wherein both of said portions are formed by finite sequences of digital symbols in a finite symbol alphabet $\mathcal{A}$. The alphabet $\mathcal{A}$ may be a finite Galois field, e.g., the mod 2 integers or strings of 1's and 0's of a fixed preselected length. The message portion is a stream of k digital symbols $u_{k-1} u_{k-2} \ldots u_1 u_0$ which is faithfully represented as an order-k polynomial U(t) of the form:

$$U(t) = u_{k-1} t^{k-1} + u_{k-2} t^{k-2} + \ldots + u_1 t + u_0.$$

In the polynomial U(t), the power of "t" determines the temporal position of the corresponding digital symbol in the first stream. The reserved portion may be located, e.g., immediately after the message portion. Prior to encoding, the reserved portion holds a stream of m digital symbols $f_{m-1} f_{m-2} \ldots f_1 f_0$, which is faithfully represented by an order-m polynomial F(t) of the form:

$$F(t) = f_{k-1} t^{m-1} + f_{m-2} t^{m-2} + \ldots + f_1 t + f_0.$$

Encoding rewrites the reserved portion of the data packet with a CRC check sequence portion of fixed length "m" or a ones complement thereof. The CRC check sequence has the form $c_{m-1} c_{m-2} \ldots c_1 c_0 \in \mathcal{A}^m$, which is faithfully represented by a CRC check sequence polynomial of the form:

$$C(t) = c_{m-1} t^{m-1} + c_{m-2} t^{m-2} + \ldots + c_1 t + c_0.$$

In first embodiments, e.g., as described with respect to FIG. 1B, the corresponding message and CRC check sequence portions form a codeword of symbol length n=k+m, which is faithfully represented by a polynomial, X(t), which satisfies:

$$X(t) = U(t) \cdot t^m + C(t).$$

In the polynomial X(t), higher-order "t" terms correspond to the digital data symbols of the message portion of the digital data packet itself and lower-order "t" terms correspond to the digital symbols of the CRC check sequence portion of the digital data packet.

Herein, a codeword refers to a polynomial in "t" that is exactly divisible by a preselected and fixed CRC generator polynomial in "t", i.e., the polynomial is divisible without a non-zero remainder. The preselected and fixed CRC generator polynomial G(t) may be written as:

$$G(t) = g_m t^m + g_{m-1} t^{m-1} + g_{m-2} t^{m-2} + \ldots + g_1 t + g_0, \text{ where}$$

$$g_{m-1} g_{m-2} \ldots g_0 \in \mathcal{A}^m, g_0 \neq 0 \text{ and } g_m \neq 0.$$

For example, a useful CRC generator polynomial G(t) is the special CRC generator polynomial:

$$G(t) = t^{32} + t^{26} + t^{23} + t^{22} + t^{16} + t^{12} + t^{11} + t^{10} + t^8 + t^7 + t^5 + t^4 + t^2 + t + 1. \quad (1)$$

The special CRC generator polynomial of Equation (1) is known as the CRC-32 polynomial and is specified by several standards, e.g., the IEEE 802.3 Ethernet standard. Various embodiments of methods and apparatus described herein, may be configured to use the CRC-32 polynomial or another polynomial as the CRC generator polynomial.

In such first embodiments, the CRC check sequence polynomial C(t) is chosen such that $U(t) \cdot t^m + C(t)$ is divisible by the CRC generator polynomial G(t), i.e., such that U(t)·t^m+C(t) is a codeword. In particular, the remainder R(t) of division of U(t)·t^m by the CRC generator polynomial G(t) is defined by:

$$R(t) = \text{remainder}\left(\frac{U(t) \cdot t^m}{G(t)}\right). \qquad (2)$$

Here, the remainder polynomial R(t) corresponds to a digital symbol sequence $r_{m-1} r_{m-2} \ldots r_1 r_0$. Thus, the CRC check sequence polynomial may satisfy C(t)=−R(t) where the minus of any coefficient is the additive inverse of the coefficient in the algebra $\mathcal{A}$. In a binary CRC code, −R(t)=R(t), because the algebra $\mathcal{A}$ of a binary CRC code is the integers modulo 2 and 1+1=0 for the integers modulo 2. Thus, the CRC check sequence polynomial is R(t) for this algebra.

In a data communications system using such an implementation of a CRC code, the transmitter, e.g., the transmitter illustrated in FIG. 1A, sends a stream of digital data symbols. In the stream, each transmitted digital data packet includes a separate message portion and a CRC check sequence portion that together correspond to a codeword X(t). Each digital data packet may also include a separate packet header and/or packet container, which are not part of the message and CRC check sequence portions of the data packet. In response to the transmission of the data packet corresponding to the codeword X(t), the receiver receives a sequence of digital data symbols that corresponds to a polynomial Y(t), where Y(t)=X(t)+E(t). Here, E(t) is a polynomial faithfully representing the locations and values of the errors in the received data packet. To determine whether a transmission error has occurred, the receiver, e.g., the receiver 14 as illustrated in FIG. 1A, evaluates a remainder of a polynomial division of Y(t) by the CRC generator polynomial G(t). In the absence of any transmission errors, the remainder of Y(t) divided by the CRC generator polynomial G(t) is a polynomial with zero coefficients, i.e., Y(t) is a codeword. In the presence of one or more transmission errors, the remainder of this division is likely to be non-zero, i.e., an error is detectable unless E(t) is itself a codeword. For example, for special generator polynomials of order m, any error sequence that is a cyclic shift of a polynomial of degree less than m produces a polynomial E(t) that is not codeword. Thus, in a received data packet, such errors are detectable via a determination of whether the corresponding polynomial Y(t) is a codeword.

In second embodiments, e.g., the second embodiment described with respect to FIG. 1B, encoding includes initializing the "m" memory elements that will hold the remainder R(t) with an all-ones sequence and effectively evaluating a remainder R(t) of the polynomial division of the polynomial U(t)·t^m+I(t)·t^k by the CRC generator polynomial G(t) where I(t)=t^{m-1}+t^{m-2}+ . . . +t+1. Thus, the polynomial R(t) satisfies:

$$R(t) = \text{remainder}\left(\frac{U(t) \cdot t^m + I(t) \cdot t^k}{G(t)}\right) \qquad (3)$$

In these second embodiments, the transmitted portions of a third sequence for the message and reserved portions of the data packet are faithfully represented by a codeword X(t) that satisfies X(t)=U(t)·t^m+C(t) where C(t)=R(t)+I(t)=F(t)+D(t). Herein, for these second embodiments of CRC coding, a data packet is faithfully represented by a polynomial that is a codeword if dividing the polynomial by the CRC generator polynomial G(t) produces an all-ones polynomial of order "m" where the reserved portion of the data packet has length "m". Thus, the receiver may initialize memory elements specifically for the CRC check sequence with an all-ones sequence and then determine whether the remainder of a polynomial division of the received sequence corresponding to Y(t), i.e., X(t)+E(t), by the CRC generator polynomial G(t) produces an all-zeros sequence to decide whether the data packet has a transmission error. The medium access control (MAC) layer in the IEEE 802.3 standard uses this alternate procedure with the standard CRC-32 generator polynomial G(t) of Equation (1).

Figure 2:
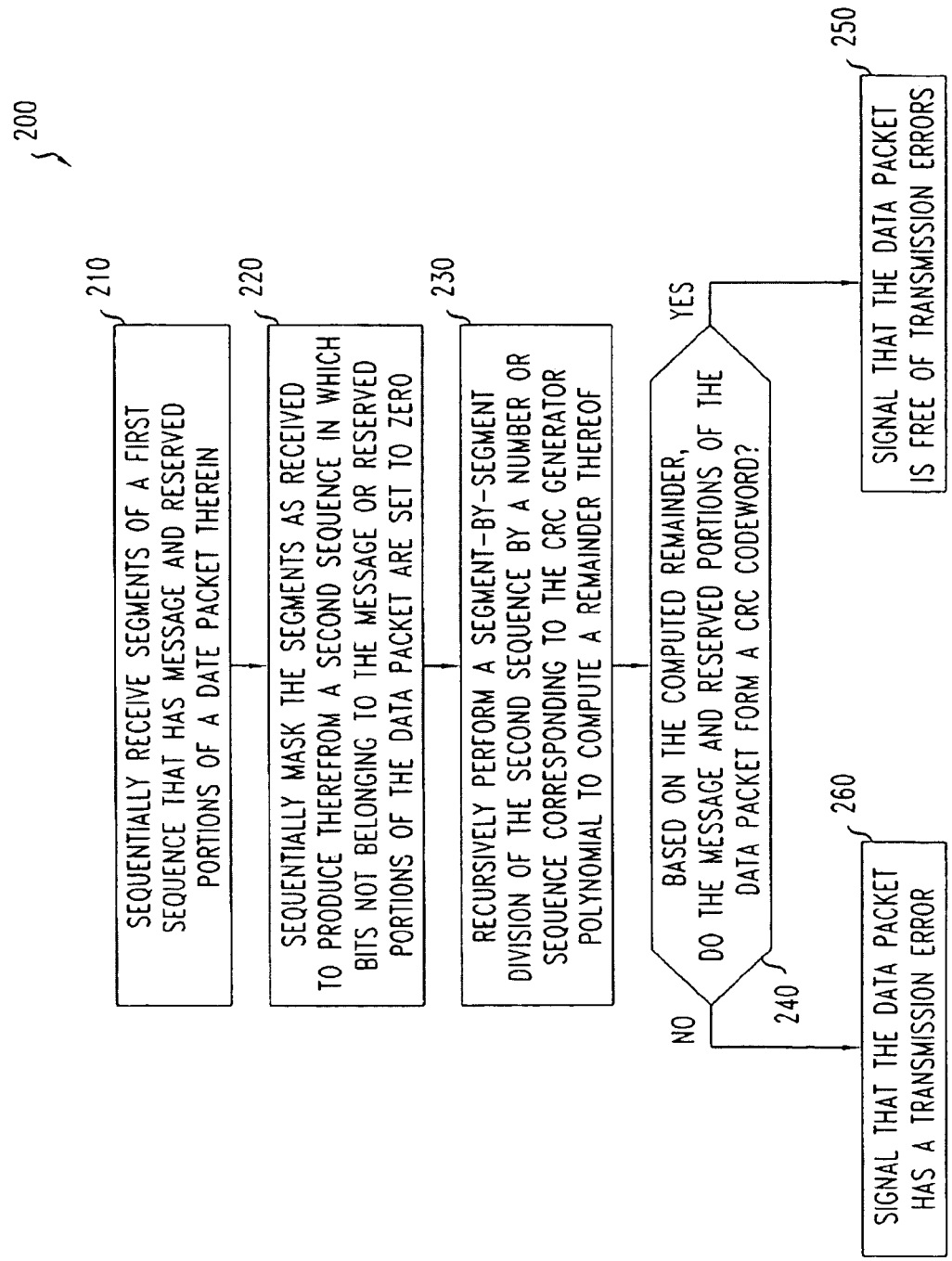
FIG. 2 is a flow diagram illustrating a method of decoding a sequence of digital data symbols, e.g., as illustrated in FIG. 1B, to determine whether the transmission of the sequence caused an error, e.g., a method for use in the receiver illustrated in FIG. 1A.
Figure 3:
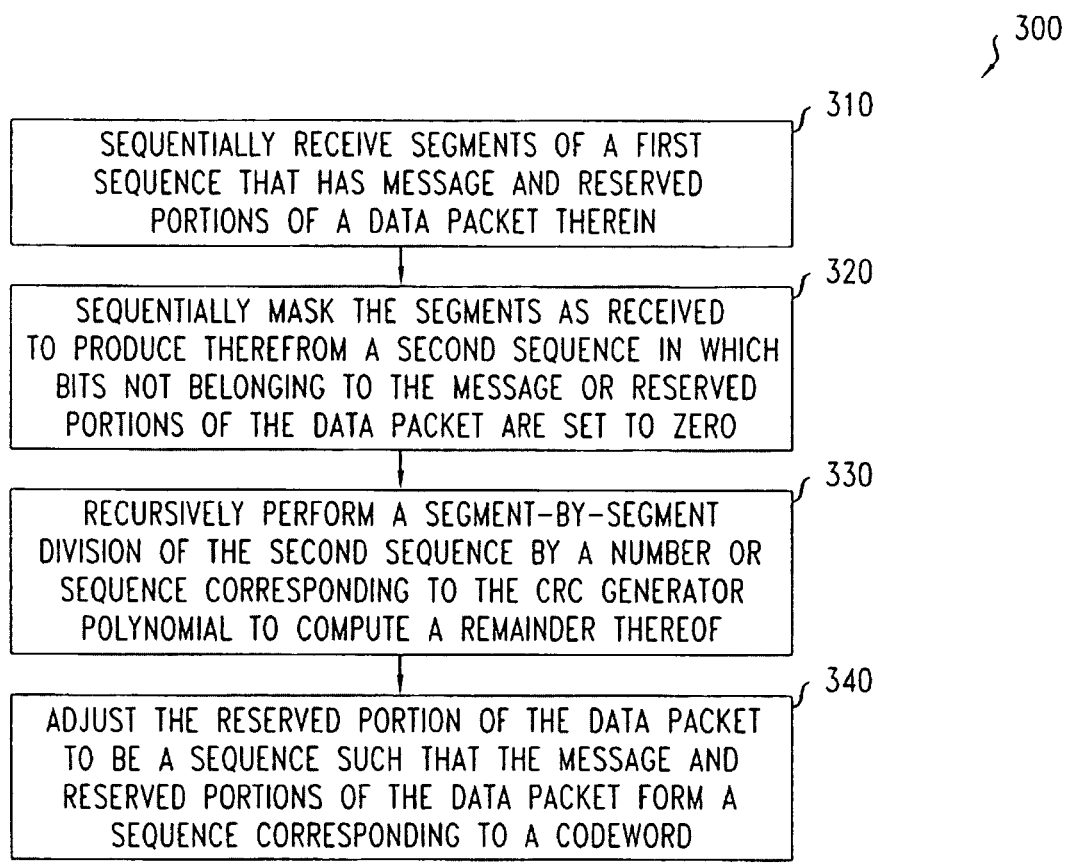
FIG. 3 is a flow diagram illustrating a method of encoding a message portion in a sequence of digital data symbols, e.g., as illustrated in FIG. 1B, to append a CRC check sequence thereto, e.g., a method for use in the transmitter illustrated in FIG. 1A.

FIGS. 2 and 3 illustrate methods 200, 300 for processing data packets that are based on a cyclic redundancy code (CRC) over the binary algebra defined by modulo addition on 0 and 1. The encoding method 300 involves preparing each data packet for transmission by evaluating a CRC check sequence for a message portion of the data packet and appending a CRC check sequence or a ones complement thereof to the message portion, e.g., in the encoder 400A illustrated in FIG. 1A. The appending step forms a sequence that corresponds to a CRC codeword. The decoding method 200 involves determining whether a received data packet has a CRC-detectable transmission error by determining whether the data packet corresponds to a CRC codeword, e.g., in the decoder 400B illustrated in FIG. 1A. The definitions of "codeword" have already been described with respect to the first and second embodiments of FIG. 1B.

At steps 210 and 310, the methods 200, 300 include, in a segment-by-segment manner, receiving segments of a first sequence that has a digital data packet therein, e.g., the receiving may be performed in the encoder 400A or the decoder 400B as illustrated in FIG. 1A. The first sequence is a sequence of "q" segments, wherein each segment has the same length "s".

Each first sequence includes a message portion of the data packet, whose sequence of bits corresponds to a polynomial U(t), and a reserved portion of the data packet, whose sequence of "m" bits corresponds to a polynomial F(t), i.e., in these methods 200, 300 of FIGS. 2-3. The reserved portion may immediately follow the message portion of the data packet. The message and reserved portions are typically located in the message portion of the data packet, e.g., after the packet header. In the first sequence, "a" bits precede the sequence corresponding to U(t) t^m+F(t), and "b" bits follow the sequence corresponding to U(t)t^m+F(t). Thus, q·s=n+a+b where "q" is the number of segments in the first sequence, "s" is the number if bits in a segment, and "n" is the number of bits in the sequence corresponding to U(t) t^m+F(t).

Here, the values of the integers "a", "b", and "n" may vary from data packet to data packet due to the different possible locations of a data packet in the first sequence and different possible lengths of a data packet. In the examples described below, the length of each segment is short enough to ensure that message portions of no more than two consecutive data packets are located in the same segment. In some other embodiments, the segments may be longer so that a part of the message portion of one data packet, message portion(s) of zero, one or more subsequent data packets, and part of the message portion of another data packet may be in one segment.

At steps 220 and 320, the methods 200, 300 include sequentially masking the "q" segments of the first sequence as the segments are received, e.g., the masking may be performed in the encoder 400A or the decoder 400B as illustrated in FIG. 1A. In a segment-by-segment manner, the masking produces a second sequence of segments in which i) the "a" bits preceding the sequence corresponding to U(t) $t^m$+F(t) are zeros, and ii) the "b" bits following the sequence corresponding to U(t) $t^m$+F(t) are zeros.

In some specific embodiments, e.g., the above-described second embodiments described with respect to FIG. 1B, the masking steps 220 and 330 also involve:

i) inverting the leading "m" bits of the sequence corresponding to U(t) $t^m$+F(t) and/or ii) inverting the final "m" bits of the sequence corresponding to U(t) $t^m$+F(t).

These specific embodiments perform this option inverting (i.e., ones complementing) of the initial "m" bits and final "m" bits of the concatenation of the message and reserved portions of the data packet. In such embodiments, the second sequence of segments is faithfully represented by a polynomial V(t) of the form:

$$V(t) = 0 \cdot t^{a+s-1} + \ldots + 0 \cdot t^{n+b} + (U(t) \cdot t^m + I(t) \cdot t^k + F(t) + I(t)) \cdot t^b + 0 \cdot t^{b-1} + \ldots + 0 \cdot t + 0. \quad (4)$$

At steps 230 and 330, the methods 200, 300 involve processing the second sequence, which corresponds to the polynomial V(t), in a segment-by-segment manner that corresponds to recursively dividing the polynomial V(t) by the CRC generator polynomial G(t). The steps 230 and 330 involve computing a remainder sequence corresponding to a polynomial $R_V^{(b)}(t)$ that is the remainder of a division of the polynomial V(t) by the CRC generator polynomial G(t). Thus, the processing steps 230, 330 effectively perform a division of V(t) by the CRC generator polynomial G(t) rather than performing a division of the message portion U(t) of the data packet by the CRC generator polynomial G(t).

At step 240, the method 200 determines whether the portion of the first sequence corresponding to the message and reserved portions of the data packet form a CRC codeword based on the remainder computed at the step 230. If this portion of the first sequence is determined to be a codeword, the method 200 includes signaling, at 250, that the data packet is transmission error-free. If this portion of the first sequence is determined to not be a codeword, the method 200 includes signaling, at 260, that the data packet has a transmission error.

At step 340, the method 300 involves adjusting the reserved portion of the data packet such that the message and reserved portions of the data packet form a sequence corresponding to a CRC codeword. The step 340 may involve determining a sequence corresponding to a check sequence difference polynomial D(t) and creating a final sequence for the message and reserved portions of the data packet. The final sequence is faithfully represented by the polynomial U(t)·$t^m$+D(t)+F(t).

In the above-described first embodiments, from the form of V(t), it follows that:

$$R_V^{(b)}(t) \equiv \text{remainder}\left(\frac{V(t)}{G(t)}\right) = \text{remainder}\left(\frac{R(t) \cdot t^b}{G(t)}\right) \quad (5)$$

If the sequence for the computed remainder polynomial $R_V^{(b)}(t)$ $R_V^{(b)}(t)$ is an all-zeros sequence of at least length m, then F(t)=C(t), and the step 340 determines that D(t)=0. If instead, the computed remainder polynomial $R_V^{(b)}(t)$ $R_V^{(b)}(t)$ is a non-zero polynomial whose length is equal to or less than m, then C(t)=F(t)+D(t) where the non-zero check sequence difference polynomial D(t) satisfies:

$$\text{remainder}\left(\frac{D(t) \cdot t^b}{G(t)}\right) = R_V^{(b)}(t) \quad (6)$$

Then, the step 340 may effectively involve solving Equation (6) via a backwards computation to obtain the symbol sequence for check sequence difference polynomial D(t) from the computed sequence for the computed remainder polynomial $R_V^{(b)}(t)$.

The step 340 may involve backwards computing the polynomial $R_V^{(0)}(t)$ from the computed remainder polynomial $R_V^{(b)}(t)$ by recursively solving another equation relating remainders $R_V^{(i)}(t)$ for different numbers "b" of trailing zeros in the sequence for the polynomial V(t). In particular, the equations relating remainders can be rewritten in a reverse-ordered form from the reverse-ordered generator polynomial. For example, $R_V^{(i-\delta)}(t)$ can be obtained from a remainder involving $R_V^{(i)}(t)$ by solving the equation:

$$R_V^{(i-\delta)}(t^{-1}) \cdot t^m = \text{remainder}\left(\frac{R_V^{(i)}(t^{-1}) \cdot t^{m+\delta}}{G(t^{-1}) \cdot t^m}\right) \text{ where } 1 \leq \delta < i. \quad (7)$$

That is, coefficients of (i-δ)-th remainder polynomial $R_V^{(i-\delta)}(t)$ are equal to a remainder obtained from dividing the i-th reverse-ordered remainder polynomial $R_V^{(i)}(t^{-1}) \cdot t^{m+\delta}$ by the reversed-order fixed polynomial $G(t^{-1}) \cdot t^m$, i.e., $G(t^{-1}) \cdot t^m = g_0 t^m + g_1 t^{m-1} + \ldots + g_{m-1} t + g_m$. For this reason, the above described recursive process can also be performed with reverse-ordered forms of remainders to obtain D(t)=$R_V^{(0)}(t)$ from the computed remainder polynomial $R_V^{(b)}(t)$. For example, one method to perform this computation for arbitrary a range of values of "b" in a certain range is described in more detail below in connection with FIG. 8.

In the above-described second embodiments, the check sequence difference polynomial D(t) is the difference between the polynomial R(t)+I(t) and the polynomial F(t), which corresponded to the reserved portion of the data packet in the first sequence. The polynomial R(t)+I(t) corresponds to the ones complement of the remainder of a division of the polynomial U(t)+I(t)·$t^{(k-m)}$ for the message portion of the data packet by the CRC generator polynomial G(t). In this embodiment, the sequence for the polynomial R(t) could also be found by backwards calculations from the sequence for the computed remainder polynomial $R_V^{(b)}(t)$ based on modified versions of Equations 6-8, which account for the inversions in the polynomial V(t) as shown in above Equation (4) for the second embodiments. A person of ordinary skill in the art would be able to easily determine said modified equations based on the above descriptions of Equations 4-8.

At step 340, the method 300 also sequentially transmits to a destination receiver a final sequence in which the data packet has the original message portion and in which the message and reserved portions form a CRC codeword faithfully represented by the polynomial U(t)·$t^m$+D(t)+F(t). In the below-described embodiments, a "word" is typically "one byte".

Figure 4A:
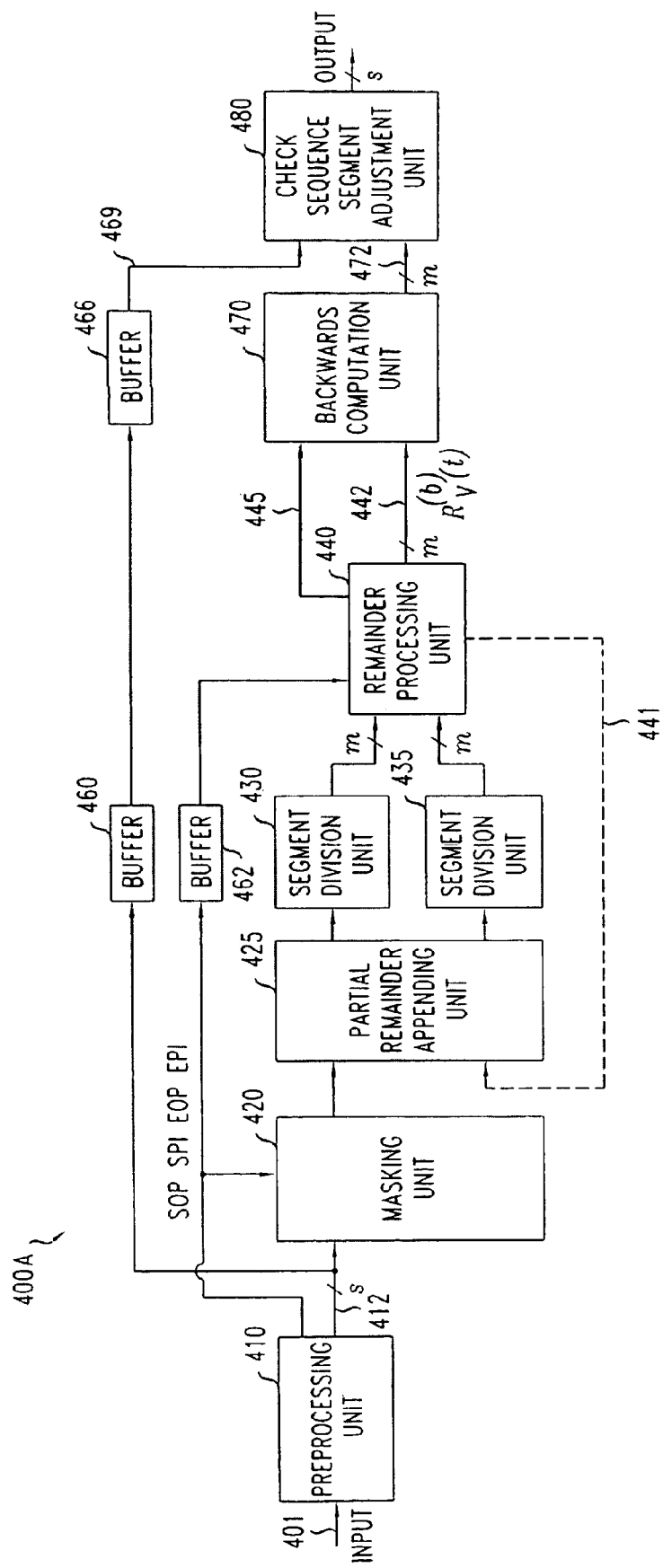
FIG. 4A is a block diagram illustrating one embodiment of an encoder, e.g., for the transmitter illustrated in FIG. 1A, wherein the encoder appends a CRC check sequence to each data packet to be transmitted, e.g., using methods of FIGS. 1B and 3.
Figure 4B:
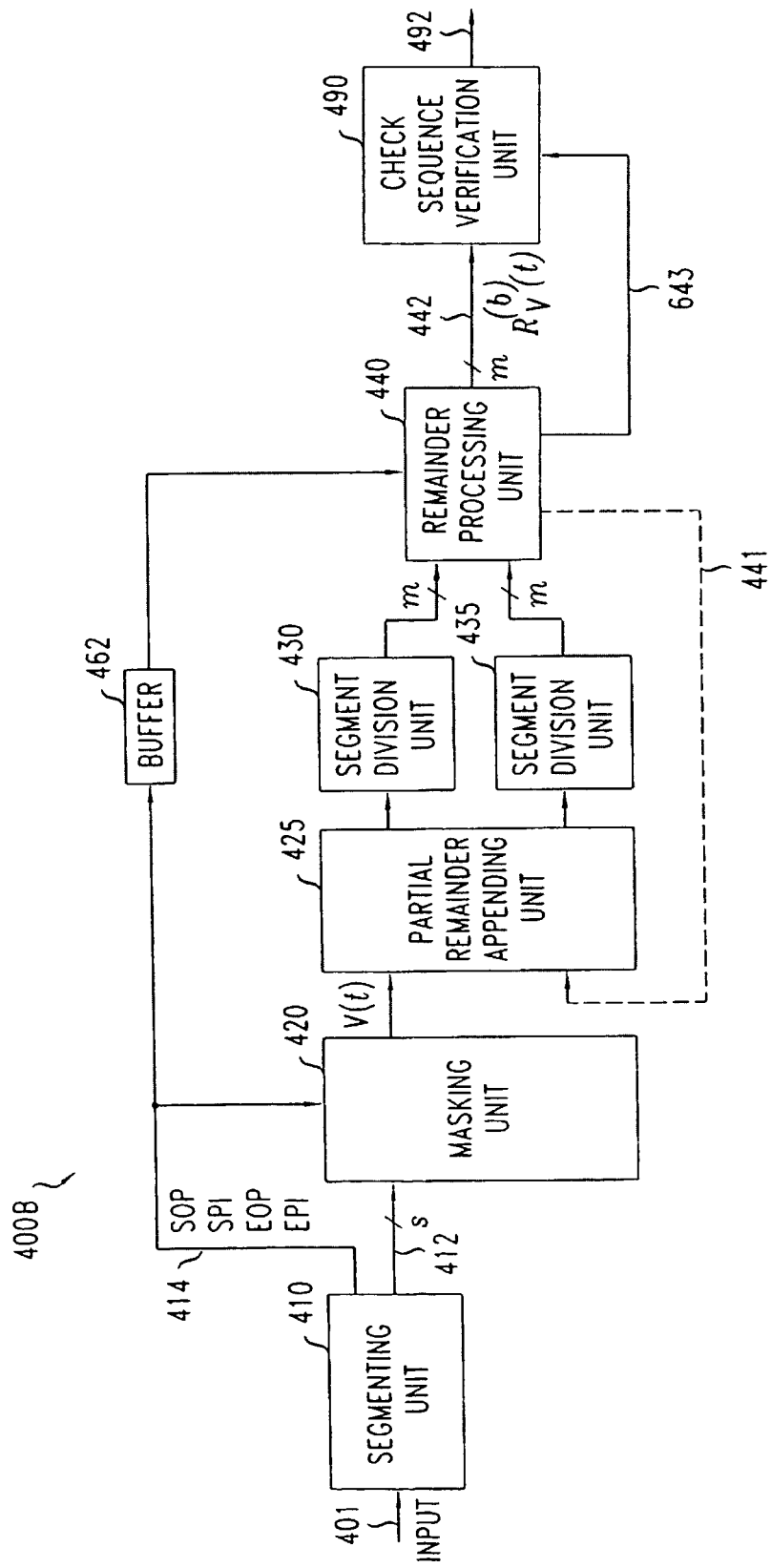
FIG. 4B is a block diagram illustrating one embodiment of a decoder, e.g., for the receiver of FIG. 1A, wherein the decoder evaluates whether a received data packet has an error based on a CRC check sequence, e.g., using the methods illustrated in FIGS. 1B and 2.

FIGS. 4A and 4B illustrate an encoder 400A and a decoder 400B, respectively. The encoder 400A may, e.g., perform the encoding method 300 of FIG. 3, and the decoder 400B may, e.g., perform the decoding method 200 of FIG. 2. The encoder 400A and decoder 400B are, e.g., conventional digital hardware devices, e.g., formed of circuits including gates, flip-flops, registers, adders, and/or multipliers. The encoder 400A and decoder 400B illustrated in FIGS. 4A-4B may be, e.g., the respective encoder 400A and decoder 400B illustrated in FIG. 1A. The encoder 400A and/or decoder 400B may be located in a network interface card (NIC) or a transport network element (TNE), e.g., an Ethernet NIC or TNE, of a transceiver for wired, wireless, or optical packet-based communications.

As shown in FIGS. 4A and 4B, the encoder 400A and decoder 400B include a set of digital data processing units. The set of digital processing units includes a segmenting unit 410; a masking unit 420; a partial remainder appending unit 425; segment division units 430, 435; a remainder processing unit 440; and one or more digital buffers 460, 462, 464, 466. The encoder also has a backwards computation unit 470 and a check sequence adjustment unit 480. The decoder 400B also has a check sequence verification unit 490. Various ones of the digital processing units process the received stream of data symbols in a substantially temporally sequential segment-by-segment manner in which each segment has the same length.

The segmenting unit 410 receives a stream of digital data symbols and consecutively transmits each consecutive equal-length segment to the masking unit 420 and information on each segment to the masking unit 420 and the partial remainder appending unit 425. The segmenting unit 410 receives the stream at input 401 and outputs segments of said stream at output 412. For each data packet, the segmenting unit 41Q outputs a sequence of "q" consecutive segments where "q" may vary from data packet-to-data packet. But, each segment is S w bytes long, i.e., s bits where s=wS and w is the number of bits in a word. In the description below, the segments are assumed to be byte-aligned. The results can be easily extended to process segments that are not word-aligned.

For each segment, the segmenting unit 410 transmits information corresponding to the segment to output port 414. The information identifies and locates any data packet start and/or data packet end located in the corresponding segment. If a segment has a data packet start, the segmenting unit 410 outputs a start-of-packet (SOP) signal of the value 1 and a start-of-packet index (SPI) that identifies the position of the data packet start in the segment. If a segment does not have a data packet start, the segmenting unit 410 outputs a SOP signal of the value 0. If a segment has a data packet end, the segmenting unit 410 outputs an end-of-packet (EOP) signal of the value 1 and an end-of-packet index (EPI) that identifies the position of the data packet end in the segment. If the segment does not have a data packet end, the segmenting unit 410 outputs an EOP signal of the value 0. The segmenting unit 410 may identify and locate a data packet start and/or a data packet end by reading a packet length identifier (PLI) in the packet header of the data packet.

Below, consecutive words of a segment are indexed in order of transmission by numerals (S−1) to 0 where higher index corresponds to earlier transmitted words. The SPI and EPI signals may be represented by a vector of length "j" of binary signals (i.e., $2^{j-1} < S \leq 2^j$) that represent each index by a binary number. The value of SPI points, e.g., to the first word for a message portion of a data packet, i.e., the portion corresponding to the polynomial U(t), and the value of EPI points, e.g., to the last word of the reserved or CRC check sequence portion of a data packet.

The masking unit 420 masks bits of segments in a segment-by-segment manner as the segments are received from the segmenting unit 410 via the output 412. From each q segments of a first sequence, i.e., having an entire data packet therein, the masking unit 420 produces a second sequence of corresponding segments, wherein the second sequence corresponds to the polynomial V(t), which has already been described. In such a second sequence, the masking unit 420 sets to zero each bit outside of the message and reserved portions of the data packet, i.e., sets to zero each bit before the sequence corresponding to $U(t)t^m + F(t)$ and sets to zero each bit after the sequence corresponding to $U(t)t^m + F(t)$. Thus, the masking unit 420 sets a first "a" bits of the first sequence to "0" and sets a last "b" bits of each first sequence to "0". In above-described second embodiments, the masking unit 420 also inverts (i.e., ones complements) the first "m" bits and the last "m" bits of the sequence corresponding to the concatenation of the message and reserved portions, i.e., the sequence corresponding to the polynomial $U(t)t^m + F(t)$.

The masking unit 420 sequentially outputs each segment of the second sequence to the partial remainder appending unit 425. The partial remainder appending unit 425 shifts a partial remainder sequence of length "m" so as to add the partial remainder to the sequence formed by most significant "m" bits of each non-leading segment of the second sequence. Here, each partial remainder sequence is a remainder from a division by one of the segment division units 430, 435 of the preceding segment of the same second sequence by the sequence corresponding to the CRC generating polynomial G(t). Such partial remainders are fed back to the partial remainder appending unit 425 from the remainder processing unit 440 via a line 441.

The segment division units 430, 435 operate on each received segment in a sequential segment-by-segment manner, e.g., each segment corresponding to a segment of the masked polynomial V(t). Via the segment-by-segment divisions, the segment division unit(s) 430, 435 output(s) a sequence of the partial remainders. Since the segment division units 430, 435 receive non-leading segments that are combined with an appropriately shifted partial remainder from previous segment divisions, the final partial remainder, i.e., produced in one of the segment division units 430, 435 by the division of the last segment of the second sequence, corresponds to the sequence for the remainder polynomial $R^{(b)}_V(t)$. That is, the final partial remainder sequence output by the segment division unit(s) 430, 435 corresponds to the remainder that would be produced by dividing the masked polynomial V(t) by the CRC generator polynomial G(t).

In some embodiments, the partial remainder appending unit 425 outputs the set of segments of the second sequence to one segment division unit 430, 435 and outputs the segments for the next second sequence to the other segment division unit 435, 430. In these embodiments, one of the segment division units 430, 435 performs a division of each such segment of one data packet by the CRC generating polynomial G(t), and the other segment division unit 435, 430 performs a division of each such segment for the next data packet in the stream by the CRC generating polynomial G(t).

In other embodiments, the partial remainder appending unit 425 selectively transmits the segments to the segment division units 430, 435 based on the amount of the segment occupied by the data packet being processed. In particular, if the segment has a data packet end, and the current data packet has more bits therein than the next data packet, the segment of the current data packet will be transmitted to the first segment division unit 430, and a shortened segment having the next data packet will be transmitted to the second segment division unit 435. Otherwise, if the current data packet has fewer bits than the next data packet, the segment of the next data packet will be transmitted to the first segment division unit 430, and a shortened segment having the remainder of the current data packet will be transmitted to the second segment division unit 435.

The remainder processing unit 440 routes the sequence for the remainder polynomial $R^{(b)}_r(t)$ to output 442 for further processing. The further processing may be performed by the check sequence verification unit 490 or by the backwards computation unit 470. For each data packet, the remainder processing unit 440 selects the sequence for the remainder polynomial $R^{(b)}_r(t)$ from one of the segment division units 430, 435 based on the SOP, SPI, EOP, and EPI information for the corresponding data packet. As already described, the remainder processing unit 440 also feeds partial remainders from the segment division units 430, 435 back to the partial remainder appending unit 425.

In the above-described second embodiments, a special situation occurs when the end of the reserved portion of a data packet is located near the start of the last segment of the second sequence. In such situations, the remainder processing unit 440 may be configured to add a correction term to the partial remainder evaluated by one of the segment division units 430, 435 for the last segment of the second sequence. More specifically, the correction term compensates for the one or more bytes that should have been inverted but were not inverted in the next-to-last segment of the second sequence when the corresponding partial remainder was computed. The correction term is the remainder that results from dividing the appropriately shifted missed ones sequence of the next-to-last segment by the CRC generator polynomial G(t). A person of ordinary skill in the art would be able to readily fabricate a look up table or combinatorial circuit that the remainder processing unit 440 would be able to use to apply such correction terms in these special situations.

In some embodiments (not illustrated in FIGS. 4A-4B), the partial remainder appending unit 425 is absent and the masking unit 420 sequentially outputs each segment of the second sequence directly to one of the segment division units 430, 435. Then, the remainder processing unit 440 modifies the final partial remainder produced by the divisions in the segment division unit(s) 430, 435 of the last segment of the second sequence by the sequence corresponding to the CRC generating polynomial G(t). In particular, the modification involves adding a correction computed from the partial remainders for divisions of the earlier segments of the second sequence by the segment division units 430, 435. The adjustment corrects the final partial remainder so that the remainder processing unit 440 will still output at the port 442 a remainder sequence corresponding to the remainder polynomial $R^{(b)}_r(t)$, i.e., the remainder obtained by dividing the masked second sequence V(t) by the CRC generator polynomial G(t).

In the masked second sequence, there may be trailing fixed digital data symbols that are not part of the corresponding data packet, e.g., entries corresponding to trailing "0"s of the polynomial V(t). As already discussed, the remainder sequence for the polynomial $R^{(b)}_r(t)$, as calculated from the masked sequence for the masked polynomial V(t), may not correspond to the CRC remainder polynomial C(t) for the data packet itself. Thus, for some of the data packets, the backwards computation unit 470 may perform a backwards calculation of the correct CRC remainder sequence for the CRC remainder polynomial R(t) or a difference sequence for the check sequence difference polynomial D(t), e.g., as discussed above. In the backwards computation unit 470, these calculations are based on the length "m" remainder polynomial $R^{(b)}_r(t)$, which are received from the output port 442 of the remainder processing unit 440. Such backwards calculations are also based on the known fixed forms of the "b" trailing zeros in the sequence for V(t), as already described, i.e., as known from the EOP and EPI signals received by the backwards computation unit 470 from line 465.

In the encoder 400A, the backwards computation unit 470 outputs the CRC check sequence for the CRC remainder polynomial R(t) or the different sequence for the check sequence difference polynomial D(t) to the check sequence adjustment unit 480 via output port 472.

In the encoder 400A, the check sequence adjustment unit 480 inserts the backwards calculated check sequence R(t) into the reserved portion of the corresponding data packet to produce a transformed first sequence for transmission to the physical communication channel. In the transformed first sequence, the sequence for the message and reserved portions of the data packet is faithfully represented by the polynomial $U(t) \cdot t^m + F(t) + D(t)$ rather than by the input sequence which was faithfully represented by the polynomial $U(t) \cdot t^m + F(t)$. The transformed first sequence is outputted at output port 482. For each data packet, the check sequence adjustment unit 480 receives the sequence for the polynomial R(t) or D(t) from the output port 472 of the backwards computation unit 470.

The check sequence adjustment unit 480 and the backwards computation unit 470 receive segments of the data packet at appropriate times via data line 469. The data line includes buffers 460, 466 that provide delays of appropriate length. The check sequence adjustment unit 480, backwards computation unite 470, and the remainder processing unit 440 receive EOP, EPI, SOP, SPI signals for data packets at appropriate times via data line 469. The control line 465 includes buffers 462, 464 that provide delays of appropriate length.

In the decoder 400B, the check sequence verification unit 490 outputs a control signal at output 492 that indicates whether a corresponding data packet is a codeword. The check sequence verification unit 490 determines the value of the control signal to be outputted based on the form of the sequence for the polynomial $R^{(b)}_r(t)$ that is received from the remainder processing unit 440. If the polynomial $R^{(b)}_r(t)$ is the all-zeros polynomial of length "m", the check sequence verification unit 490 typically outputs a signal indicating that the corresponding data packet is transmission error-free. But, if the polynomial $R^{(b)}_r(t)$ is another polynomial of length "m", the check sequence verification unit 490 typically outputs a signal indicating that the corresponding data packet has transmission error.

To briefly summarize, in the encoder 400A, the masking unit 420 transforms a first sequence of segments from the segmenting unit 410 into a second sequence of masked segments that correspond to the masked polynomial V(t), e.g., Equation (5). In the encoder 400A, the segment division units 430, 435 and the remainder processing unit 440 together generate a sequence of segments corresponding to the remainder polynomial $R^{(b)}_r(t)$, e.g., according to Equation (6). The backwards computation unit 470 effectively determines the CRC check sequence adjustment polynomial D(t) or the CRC remainder polynomial R(t) from the remainder polynomial $R^{(b)}_V(t)$, e.g., based on Equation (9), and the sequence for this polynomial may be used further in the check sequence adjustment unit 480.

In alternate embodiments, other digital devices may replace the combination of the masking unit 420, partial remainder appending unit 425, segment division units 430, 435, and remainder processing unit 440. For instance, if a segment contains parts of at most one data packet, it may not be necessary to have either two segment division units 435, 430 and/or the remainder processing unit 440.

As described above, one or more of the embodiments described herein relate to systems or methods for generating a CRC check sequence for a data packet and writing the generated CRC sequence or a ones complement thereof into the data packet prior to transmission.

Example of Segment Processing and Other Example Embodiments

FIG. 5 illustrates the processing of an example data packet via some embodiments of the encoder 400A of FIG. 4A. The data packet is located in a first sequence 510 of digital data symbols that is formed of four consecutive, disjoint, equal length segments 522, 524, 526, 528. The processing includes generating a second sequence of masked segments 570 and computing a CRC check sequence 580 from the second masked sequence of segments. Below, the processing will be described in relation to FIG. 6, which is block diagram of an example of the masking unit 420 and the partial remainder appending unit 425 of FIG. 4A. The masking unit 420 the partial remainder appending unit 425 are operated based on a finite state machine (FSM) 700 shown in FIG. 7.

In FIG. 5, the first sequence 510 of four segments 522, 524, 526, 528 includes the data packet, which has a message portion 514 and a reserved portion 516 for the CRC check sequence. The first and fourth segments 522, 528 have portions 512, 518 that do not belong to the data packet, i.e., the data and reserved portions 514, 516 of the data packet.

FIG. 5 illustrating processing the segmenting unit 410, the masking unit 420, the partial remainder appending unit 425, the segment division units 430, 435, the remainder processing unit 440, and the backwards computation unit 470 of FIG. 4A. The segmenting unit 410 sequentially outputs the segments 522, 524, 526, 528 of the first sequence 510 and information defining positions of ends and starts of data packets therein to the masking unit 420. The masking unit 420 sequentially transforms the segments 522, 524, 526, 528 of the first sequence 510 into masked segments 536, 546, 556, 556 of the second sequence 570. The transforming involves masking initial and final portions 512, 518 of the first sequence 510, which are not in the data packet, to zero, i.e., 6 bytes each, and may include ones inverting the same number of initial and final bytes of the data packet, i.e., 4 bytes each in the example (inversion of a byte is indicated by a dash). The partial remainder appending unit 425 adds intermediate or partial remainders 538, 548, 558 from earlier polynomial divisions of the leading segments 522, 524, 526, i.e., in segment division units 430, 435, to most significant bytes of the non-leading segments 524, 526, 528. In such embodiments, the partial remainders 538, 548, 558 are fed back to the masking unit 420 via the remainder processing unit 440 or via the segment division unit(s) 430, 435. Each segment division unit 430, 435 divides each masked segment 536, 546, 556, 566, i.e., with an appended partial remainder for the non-leading masked segments 524, 526, 528, by a sequence corresponding to the CRC generating polynomial G(t) thereby producing the partial remainders 538, 548, 558, 568. The remainder processing unit 440 outputs the last segment's remainder 568, which corresponds to the remainder polynomial $R^{(b)}{}_r(t)$ to the backwards computation unit 470. The backwards computation unit 470 computes the CRC check sequence 580 corresponding to the CRC remainder polynomial R(t) or the CRC difference sequence corresponding to the difference polynomial D(t) from the last segment remainder 568.

Figure 6:
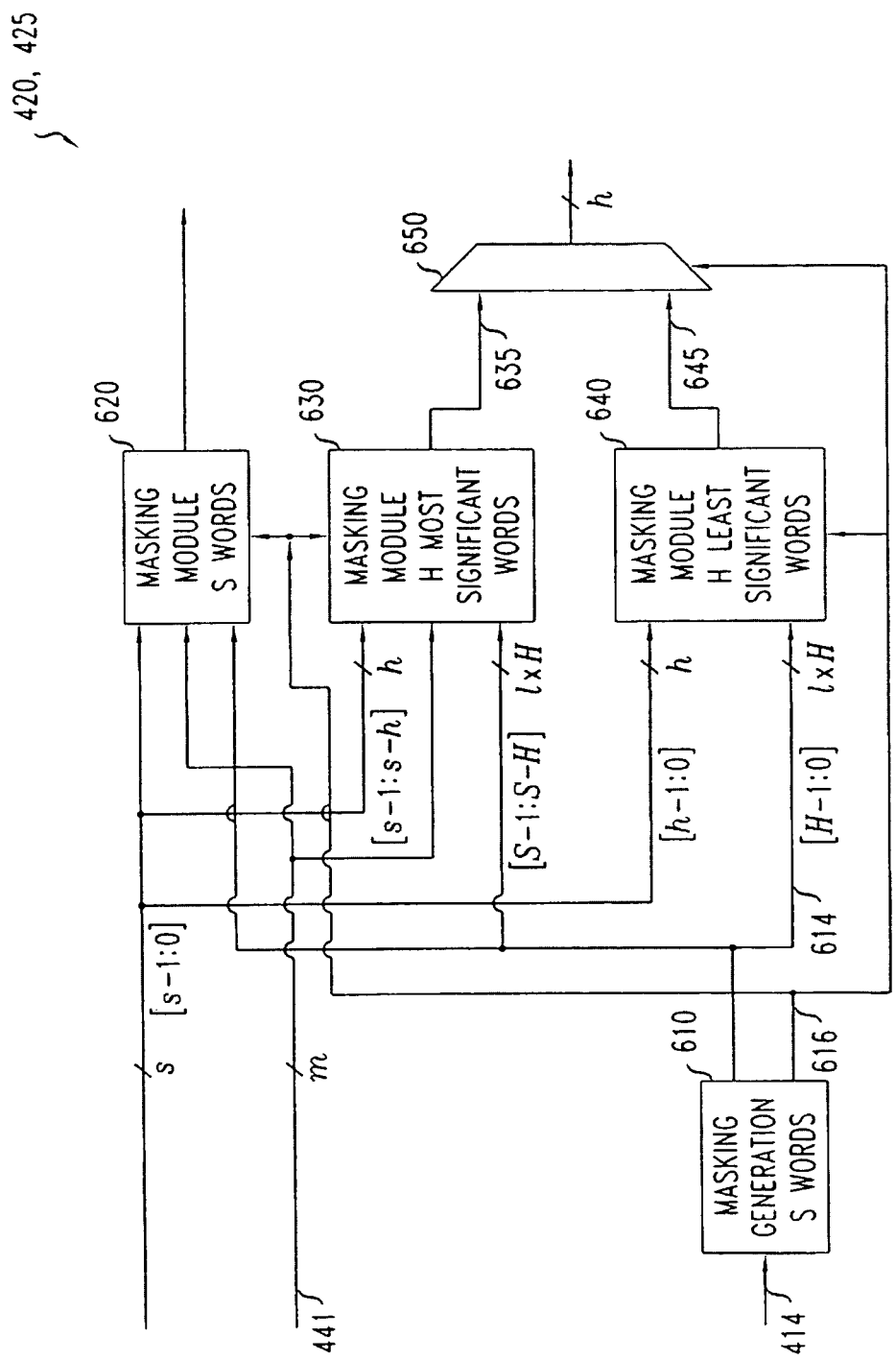
FIG. 6 is a block diagram illustrating one embodiment of a combined masking unit and partial remainder appending unit that may be used, e.g., in some specific embodiments of the encoder and decoder illustrated in FIGS. 4A-4B.
Figure 8:
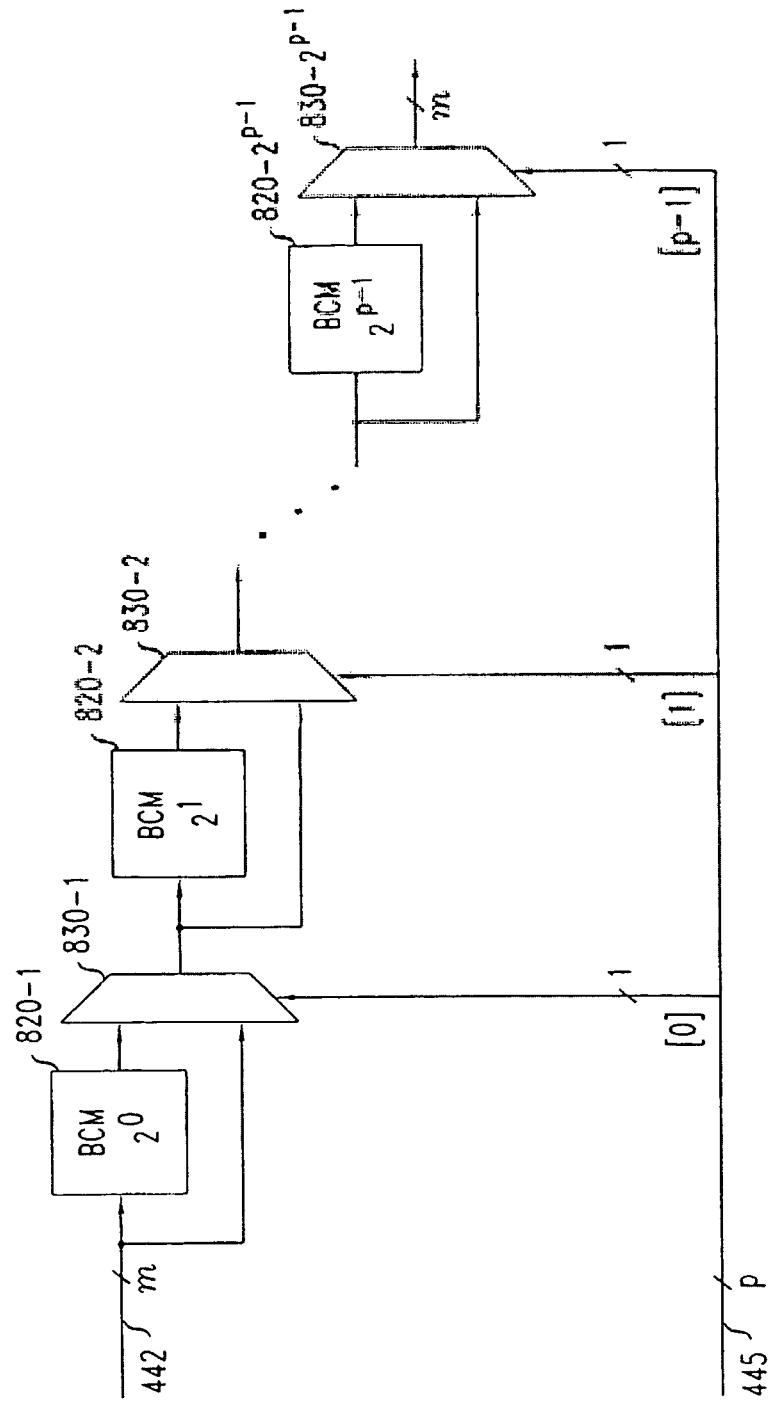
FIG. 8 is a block diagram illustrating a specific embodiment of a backwards computation unit that may be used in some embodiments of the encoder illustrated in FIG. 4A.

FIGS. 6 and 8 illustrate specific embodiments of the masking unit 420, the partial remainder appending unit 425, and the backwards computation unit 470 of FIGS. 4A-4B.

Referring to FIG. 6, the segmenting unit 410 transmits segments of length s, i.e., Sw or 20 bytes in FIG. 5, to masking modules 620, 630, 640 of the masking unit 420. The masking unit 420 may also include a mask generation module 610 that receives information about positions of ending and starting segment indices of data packets.

Figure 7:
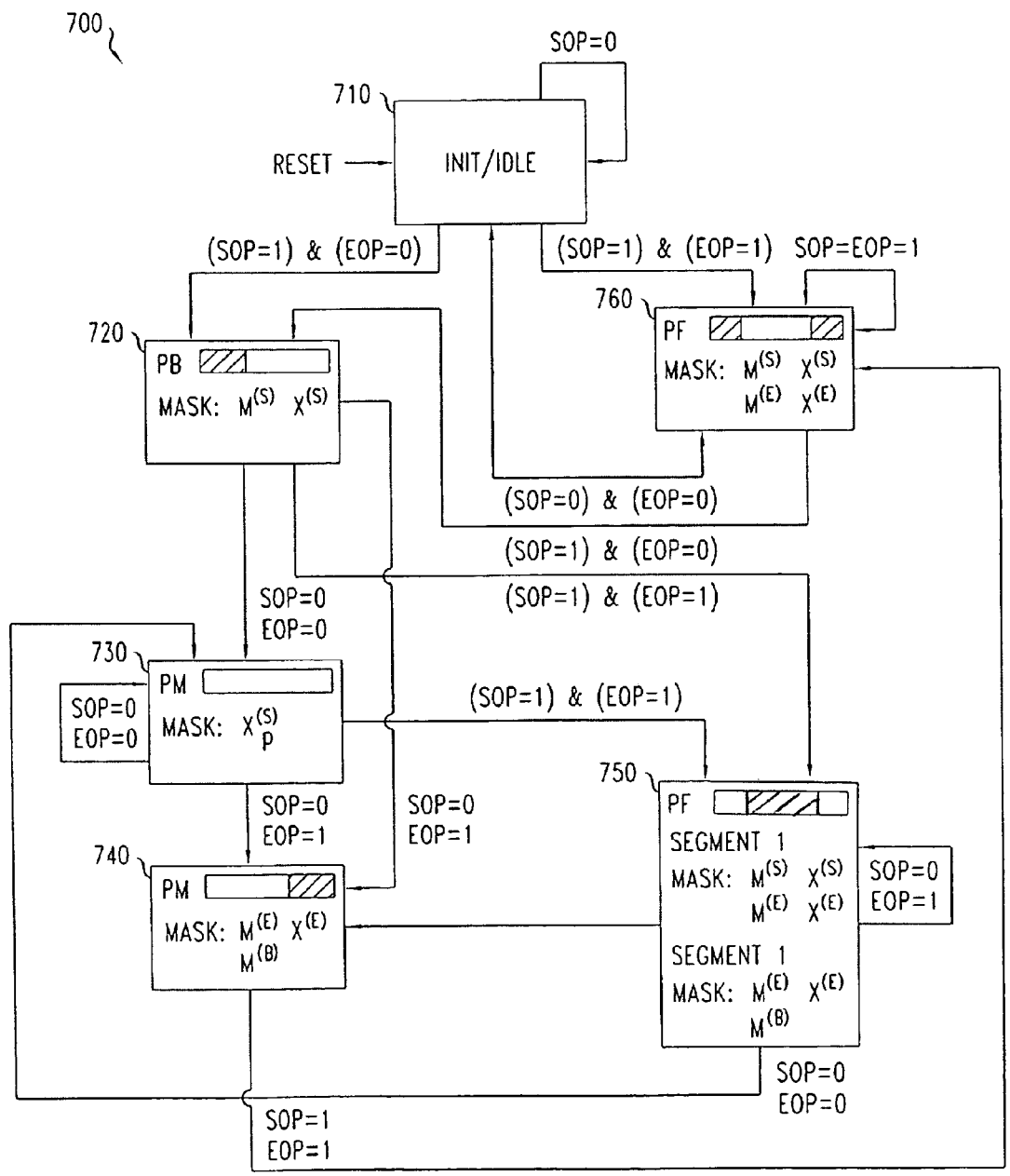
FIG. 7 is a state diagram illustrating the operation of the combined masking unit and partial remainder appending unit illustrated in FIG. 6.

The mask generation module 610 interprets this information according to the example finite state machine (FSM) 700 that is illustrated in FIG. 7. At initialization, the FSM is in the INIT/IDLE state 710. The FSM remains in the INIT/IDLE state as long as the received values of SOP are "0". If a later received (SOP, EOP) pair indicates that SOP=1 and EOP=0, the corresponding segment has a start of a data packet, e.g., the segment 522 of FIG. 5. The FSM changes to the Packet-Begin (PB) state 720 if the data packet does not also have an end of a data packet, e.g., as in segment 522 of FIG. 5. The FSM changes to the Packet-Full (PF) state 760 if the segment also has an end of data packet, i.e., if EOP=1. In the PB state 720, the masking unit 420 of FIG. 6 sets any initial part of the segment that is outside of the data packet to a zero sequence and inverts the first m bits of the data packet itself, e.g., mw=4 bytes in FIG. 5. To perform these transformations, the mask generation module 610 produces masks $M^{(S)}$ and $X^{(S)}$ to have forms defined by the received value of the SPI signal. If the values of SOP and EOP are zero in the next segment, e.g., the segment 524 of FIG. 5, the FSM changes to the Packet-Middle (PM) state 730. The first time that the FSM is in the PM state, the encoder determines whether the data packet started at the end of the last segment so that any remainder of the mask $X^{(S)}$ for the previous segment is fed to masking unit 620 to invert first words of the current segment (at most ((m/w)−1) words are to be inverted as specified by $X_p^{(S)}$. Otherwise, the PM state typically does not perform masking of segments. The FSM 700 will remain in state PM 730 until the value of EOP changes to 1 to indicate that an end of packet is located in a segment.

The FSM remains in the PM state 730 until the value of EOP changes to 1. If the value of SOP is still zero, the FSM changes to the Packet-End (PE) state 740 in response to EOP changing to 1. For the PE state 740, the mask generation module 610 produces two masks $M^{(E)}$ and $X^{(E)}$, which are fed to the masking module 620 to set the portion of the segment outside of the data packet to zero and to bit-wise invert a portion of length m at the end of the data packet. If the value of SOP changes to 1 along with EOP, the segment contains the end of the data packet being processed and the start of the next data packet. Such values of EOP and SOP cause the FSM to change to the Packet-Double (PD) state 750 in which both segment division units 430, 435 are used.

In the PD state 750, there are two processing cases. In the first case, the segment has an end portion of a data packet that is longer than the start portion of the next data packet in the segment. In this case, the end portion of the data packet is processed in the masking module 620 like in the PE state 740 and the segment division unit 430 uses the masks $M^{(E)}$ and $X^{(E)}$. In this case, the starting portion of the new data packet, which has less than H words, is processed in parallel in the masking module 640 and the segment division unit 435, i.e., using the H least significant bits of the masks $M^{(S)}$ and $X^{(S)}$ in a similar fashion as in the PB state 720. In the second case, the segment has an end portion of a data packet that is shorter than the start portion of the next data packet in the segment. In this case, the end of the data packet, which has less than H words, is processed in the masking module 630 and the segment division unit 435 using the H most significant bits of the two masks $M^{(E)}$ and $X^{(E)}$ similarly to the PE state 740. In this case, the starting portion of the new data packet is processed, similarly to the PB state 720, in the masking module 620 and the segment division unit 430 using the two masks $M^{(S)}$ and $X^{(S)}$.

Finally, if the FSM 700 is in the INIT/IDLE state 710 or the PE state 740 and the values of SOP and EOP both become 1, the FSM changes to the PF state 760. In the PF state 760, the entire packet is contained in one segment. In this case, the segment is modified in the masking module 620 by application of the four masks $M^{(S)}$, $X^{(S)}$, $M^{(E)}$, and $X^{(E)}$, and the CRC remainder is determined by the segment division unit 430.

The FSM 700 may include simultaneously checking the validity of information related to start(s) of packets and/or end(s) of packets. For example, in the PM state 730, the FSM may send an error message if SOP becomes 1, and the FSM may then return to the INIT/IDLE state 710. The FSM may include performing other checks of the validity of ranges of the SPI and EPI signals. For example, in the PD state 750, the EPI and SPI signals should indicate that the distance between the end of the data packet and the beginning of the next data packet is equal to or larger than a predefined inter-packet gap length.

FIG. 6 illustrates embodiments of the masking generation module 610 and the masking modules 620, 630, and 640. When SOP=1, the mask generation module 610 processes the SPI signal, representing the start of packet index $i_S$, to generate a binary mask $M^{(S)}$ whose components have indices from (S-1) to 0, i.e., corresponding to S words. The components with indices larger than $i_S$ are zero, and the components with indices smaller than or equal to $i_S$ are one. The mask generation module 610 generates the binary mask $X^{(S)}$, which indicates which words are to be inverted. In the binary mask $X^{(S)}$, components $i_S$ to $\max(i_S-m/w+1, 0)$ are one, and the other components are zero. If $(i_S-m/w+1)<0$, the components (S-1) to $(S-(i_S-m/w+1))$ of the binary mask $X^{(S)}$, which correspond to the next segment, are also one. The masks $M^{(S)}$ and $X^{(S)}$ are distributed to the masking modules 620, 630, and 640, and used selectively in a manner dependent on the state of the FSM 700.

In one embodiment, masking replaces each digital data symbol of the first sequence that is outside the data packet replace with zero and inverts leading and final digital data symbols of the data packet. The zero-valued components of the mask $M^{(S)}$ identify portions of the segment, which are not in the data packet, and the unit-valued components of the mask $M^{(S)}$ identify the portions of the first sequence, which are in the data packet. A word of a first sequence may be selectively set to zero or left unchanged by processing the word with w AND gates controlled by a corresponding component of $M^{(S)}$. If a component of the mask $M^{(S)}$ is zero, the AND gates replaces the corresponding word by zero, and if the component of the mask $M^{(S)}$ is one, the AND gates do not change the corresponding word. Similarly, the unit-valued components of the mask $X^{(S)}$ identify portions of the segment to be inverted. A word of a first sequence is selectively set to inverted or left unchanged by such processing with w XOR gates controlled by a corresponding component of $X^{(S)}$. If a component of the mask $X^{(S)}$ is one, the XOR gate replaces the corresponding word by a ones inverse, and if the component of the mask $X^{(S)}$ is zero, the XOR gate does not change the corresponding word.

In FIG. 5, the segment 522 of length 20 (bytes/words) enters the masking unit 420 with information indicating that six bytes precede the start of the packet. For that reason, the mask generation module 610 replaces the first six bytes by zeros. The mask generation module also causes bytes 7-10 of the segment to be inverted.

Referring to FIG. 6, the combination of masking and partial remainder appending units 420, 425 may restart the remainder calculation in response to detecting a start of a new data packet in mask generation module 610. More specifically, the masking modules 620 and 630 may have multiplexers that select between a fed back remainder and a zero input as the fed back remainder. When the value of SOP is one, the multiplexer selects the zero input to restart the polynomial divisions for evaluating the sequence for the remainder polynomial $R_r^{(b)}(t)$.

Referring again to FIGS. 4A, 4B, 5 and 6, the partial remainder appending and remainder processing units 425, 440 may enable updates of the non-leading segments 546, 556, 566 of the second sequence 570 by appending previously computed partial remainders 538, 548, 558 to the most significant parts thereof. The calculation of each partial remainder 538, 548, 558, 568 involves dividing such updated and masked segments 536, 546, 556, 566 by a fixed divisor sequence, e.g., the CRC generator polynomial G(t), in the segment division units 430, 435. In this way, the masking unit 420, the partial remainder appending unit 425, and the remainder processing unit 440 support the calculation of the remainder for the remainder polynomial $R^{(b)}_r(t)$ when a data packet stretches across a plurality of segments via iterative calculations on the individual segments 536, 546, 556, 566.

For example, the remainder is computed iteratively in the example of FIG. 5 as follows. In the first iteration, the FSM 700 enters the PB state 720 and forms and applies the $M^{(S)}$ mask 532 and the $X^{(S)}$ mask 534 to the segment 522 of the first sequence to obtain the first masked segment 536 of the second sequence 570. Then, the masked segment 536 is processed in the segment division unit 430 to obtain the first partial remainder 538. In the next iteration, the FSM 700 enters the PM state 730, and the masking unit 420 takes the next segment 524 as input and generates the masks for the given FSM state to form the second segment 546, thereby forming the second segment of the second sequence 570. The partial remainder 538 is fed back to the partial remainder appending unit 425 and is added to the most significant part of the next segment 546, after which the segment division unit 430 processes the resulting segment to determine the next partial remainder 548. In the next iteration, the FSM 700 enters the PM state 730, and the segment 526 is processed to obtain the third segment 556 of the second sequence 570 in unit 420. The partial remainder 548 is fed back to the partial remainder appending unit 425 and is added to the most significant part of the next segment 556, after which the segment division unit 430 processes the resulting segment to determine the next partial remainder 558. In the last iteration, the FSM 700 changes to the PE state 740 and forms and applies the $M^{(E)}$ mask 562 and the $X^{(S)}$ mask 564 to the segment 528 of the first sequence to form the last segment 566 of the second sequence 570. In addition, the partial remainder 558 is fed back to the partial remainder appending unit 425 and is added to the most significant part of the next segment 566, after which the segment division unit 430 processes the resulting segment to determine the next partial remainder 568, which would be produced by dividing the masked second sequence 570 by the CRC generator polynomial G(t).

The above procedure enables the segment division units 430, 435 to compute the partial remainders 538, 548, 558, 568 in the same fashion regardless of the location of the start of a data packet in the segment 522 of the first sequence 510. The remainder processing unit 440 may use signal information to determine whether an end of the packet is in a segment thereby determining whether a remainder should be output.

The mask generation module 610 may generate a bit level inversion mask $X^{(B)}$, which may also be transmitted to one or more of the masking modules 620, 630, 640. A bit level inversion signal may be used to instruct the masking modules 620, 630, and 640 to perform inversions of their respective portions of the (m/w) most significant words of the segment on a bit level, if the check sequence segment contained in the packet spans two segments.

For example, in an embodiment where the last (m/w) words of the data packet are to be inverted, bit level inversions may be employed to account for an end-of-packet in the first ((m/w)−1) words of the segment. This bit level inversion is employed because one or more words that should have been inverted were not inverted, because the words were processed with a previous segment. While the l mask signals are shown as being coupled to all masking modules 620, 630, 640, and as having width S, (S-H), and H, respectively, in alternate embodiments, some of the l masks may be coupled only to those masking modules that fall within the number of words to be inverted.

The S-word masking module 620, and the (S-H) word and H-word masking modules 630 and 640 may include multiple banks of AND gates and multiple banks of XOR gates. The banks of AND and XOR gates function to enable word-level masking and addition of the partial remainder from line 441 to the segment of the second sequence. The bank of XOR gates enable inversion of one or more of the incoming bits to the masking modules 620, 630, and 640, and the banks of XOR gates enable inversion of every bit (i.e., the entire word) of the portion of the data segment 412 entering the masking modules. In alternate embodiments, other logic devices and/or structures may replace the banks of AND gates and/or banks of XOR gates to realize such masking functions.

As described above, the masking unit 420 may mask words of a data segment by setting words of the segment that do not belong to the packet to zero and or may ones invert one or more words at the start and/or the end of the data packet.

Referring to FIG. 5, the processing begins by receiving a segment of the first sequence. Next, the mask generation module 610 determines whether a new packet starts within the received segment based on the information from output port 414 of the segmenting unit 410 and the current state of the finite state machine 700. If a new packet does start in the segment, e.g., segment 522, the masking generation module 610 may produce mask vectors to set bytes preceding the start of the new data packet and/or to invert the first m/w words of the new data packet. In FIG. 5, the start of the new data packet is at the seventh byte in segment 522 and, the masking generation module 610 produces mask vector $M^{(S)}$ 534 and inversion mask vector $X^{(S)}$ 536 to mask the first six words of the segment 522 and invert words 7-10 in masking module 620.

If the received segment does not have a start of a new data packet, the masking generation module 610 determines whether an end of the data packet is in the segment, as indicated by state PM 730. If there is not an end of the data packet is in the received segment, the masking unit 620 will not mask or invert bytes of the segment. If, however, the data packet does end in the received segment, the mask generation module 610 determines whether the end of the packet falls within the first (m/w)−1 words of the segment (PE state 740 and PD state 750).

If the end of the data packet is in the first (m/w)−1 words of the segment, the masking unit 420 may mask the words following the end of the packet by setting said words to zero and/or may invert the last (m/w) words of the data packet. In one embodiment, the masking unit 420 masks words following the end of the data packet with mask $M^{(E)}$ and inverts the last (m/w) words of the data packet with mask $X^{(E)}$.

If the end of the data packet does fall within the first (m/w)−1 words of the data segment, then one or more bytes, which are inverted if processing is according to IEEE 802.3 or other suitable standards, may have been previously processed without inversion, because the end of the data packet did not occur in a segment containing the one or more words that should have been inverted. Thus, if the end of the data packet occurs within the first (m/w)−1 words of the segment 412 (e.g., in the PE state 740 and the PD state 750), the masking unit 420 masks words following the end of the packet.

Referring to FIGS. 4A-4B, the remainder processing unit 440 may calculate the remainder for the last segment having part of the data packet therein. In particular, in the PE and PF states 740, 760, the segment division unit 430 will calculate the remainder for the last segment in the manner already described. It will be appreciated that if the remainder processing unit 440 feeds back partial remainders, the remainder calculated by the segment division unit 430 for the last data segment is the remainder for the entire data packet as well as the zeros that replace bytes following the end of the data packet. The remainder processing unit 440 produces such a remainder whenever the end of a packet has been reached. If the remainder processing unit 440 does not feed back partial remainders, the remainder processing unit 440 determines the remainder polynomial at line 441 multiplied by "$t^S$", after which the resulting remainder from this computation is added from output port of the segment division unit 430 to form the sequence for the remainder polynomial $R^{(b)}{}_V(t)$. In the PD state 750, the masking unit 420 selects either segment division unit 430, 435 to determine the remainder of the last packet, and the remainder processing unit 440 selects the output of either segment division unit 430, 435 to determine the sequence for the remainder polynomial $R^{(b)}{}_V(t)$.

The remainder polynomial $R^{(b)}{}_V(t)$ calculated from the masked polynomial V(t), which has extra zeros following the end of the data packet, may differ from the CRC check sequence polynomial R(t) for the data packet alone.

Referring to FIG. 8, the backwards computation unit 470 is configured to backwards compute the CRC check sequence polynomial R(t) from the remainder polynomial $R^{(b)}{}_V(t)$ by removing the effects of the trailing zeros in the masked polynomial V(t). More specifically, the backwards computation unit 470 includes a plurality of backward computation modules 820-0, 820-1, . . . , 820-(p−1), wherein each computation modules 820-0, 820-1, . . . , 820-(p−1) is configured to calculate what the remainder would have been if the segment containing the end of the data packet had been shorter by a particular amount specified by control signal from line 445. For example, the backwards computation module 820-0 is configured to calculate what the CRC check sequence that would have been if the polynomial division had stopped one byte before the end of the segment. Generally, the backwards computation module 820-k is configured to calculate what the check sequence would have been if the polynomial division had stopped $2^k$ bytes before the end of the segment.

The illustrated backwards computation unit 470 may include p serially concatenated backward computation modules, each such module is configured to backwards-calculate $2^q$ bytes for distinct values of "q" satisfying 0≤q<p.

By selecting a combination of the backwards calculation modules 820-0, 820-1, . . . , 820-(p−1), the backwards computation unit 470 can selectively backwards calculate the CRC check sequence polynomial R(t) from the remainder polynomial $R^{(b)}{}_V(t)$ for any value of b between zero and $-2^p-1$. More specifically, in the embodiment illustrated in FIG. 8, the backwards computation unit 470 includes a plurality of multiplexers 830-0, 830-1, . . . , 830-(p−1) which operate to activate or bypass selected backwards calculation modules 820-0, 820-1, . . . , 820-(p−1) based on the sum of the number of trailing bytes masked to zero, i.e., b. Here, the backwards calculation module 820-*k* is a hardware device implementing Equation (7) for δ=2^*k*.

For example, if the last 7 bytes of segment 528 are masked to zero, the packet's CRC remainder or CRC check sequence polynomial R(t) 580 is backwards computed 7 bytes. That is, the signal at line 445 indicates the binary number "00111". Thus, the multiplexers 830-0, 830-1, . . . , 830-2 corresponding to backwards calculating 1 byte, 2 bytes, and 4 bytes would be activated, and the backwards calculation modules for backwards calculating 8 bytes and 16 bytes would be bypassed to produce a total backwards calculation of 7 bytes.

The above backwards computation of the remainder R(t) is feasible because zeros at the end of the final masked segment deterministically affect the evaluation of a remainder. For that reason, the actual CRC check sequence can be found from the computed remainder polynomial $R^{(b)}{}_{V}(t)$ and the location of the end of the data packet. Moreover, the backwards computation unit 470 can enable the segment division units 430, 435 to perform remainder calculations in the same fashion regardless of the location of the end of the data packet. The segment division units 430, 435 process a sequence of consecutive equal length segments, which may improve the efficiency and/or decreasing the size and fabrication cost of the encoder 400A of FIG. 4A with respect to alternative CRC encoders that would require more parallel or serial division units to determine the desired remainder.

Referring again to FIG. 4A, after backward computation of a sequence for the CRC remainder polynomial R(t), the backwards computation unit 470 outputs a CRC check sequence of length m or a sequence of length m for the previously described difference polynomial D(t) to the check sequence segment adjustment unit 480 via output port 472. The backwards computation unit 470 also outputs information on the position of the reserved portion of the data packet to the check sequence segment adjustment unit 480 via output port 474. The check sequence adjustment unit 480 uses the position information to identify the reserved portion of the data packet in the original data stream on the delay line 469 and to produce at the output port 482 a data stream in which the reserved portion of the corresponding data packet has the CRC check sequence therein.

Lastly, such CRC check sequence appended data packets can be transmitted from the output port 482 to a communications channel via a variety of suitable transmitters and transmission protocols (e.g., Ethernet, Gigabit Ethernet, or Evolution Voice/Data Only).

When the data packet reaches its destination, the receiver may use the decoder 400B of FIG. 4B to calculate a CRC remainder for the data packet for use in identifying errors that may have occurred during transmission. If the received data packet is not found to be a CRC codeword, there is a high likelihood that the one or more bits of the packet were altered during transmission.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

We claim:

1. A method of processing a sequence of disjoint data segments of equal length, the sequence including a particular data packet, comprising:

forming a masked data segment of the length by masking a portion of one of the data segments, a portion of the particular data packet being in the one of the data segments and being outside of the masked portion, the start of the particular data packet being in the one of the data segments and being mis-aligned with a start of the one of the data segments;

forming a modified segment of the length by modifying a start or end of the particular data packet; and calculating a cyclic redundancy check for the particular data packet by performing a calculation with the masked segment and the modified segment.

2. The method of claim 1, comprising comparing the calculated cyclic redundancy check to zero.

3. The method of claim 2, wherein the calculating a cyclic redundancy check comprises calculating a check sequence value based at least partially on another cyclic redundancy check transmitted with the data packet.

4. The method of claim 1, comprising inverting one or more symbols at the start of the data packet.

5. The method of claim 1, comprising inverting one or more symbols at the end of the data packet.

6. The method of claim 1, wherein the modifying includes modifying the start of the particular data packet.

7. The method of claim 6, wherein the modifying includes modifying the end of the particular data packet.

8. The method of claim 1, further comprising forming another masked data segment of the length by masking an end portion of another of the data segments, an end of the particular data packet being in the another of the data segments and being outside of the masked end portion thereof.

9. The method of claim 8, wherein the end of the particular data packet is mis-aligned with an end of the another of the data segments.

10. The method of claim 9, wherein the calculating a cyclic redundancy check includes performing a calculation on the another masked data segment.

11. The method of claim 1, wherein the modifying includes modifying the end of the particular data packet.

12. A system for processing a data packet located in a first sequence of disjoint original segments, each original segment of the first sequence having the same length, comprising:

a masking unit configured to modify one or more symbols in a first of the original segments of the first sequence where a start of the data packet is in the first of the original segments and is after a first symbol therein, the masking unit being configured to modify one or more symbols in a last of the original segments of the first sequence where an end of the data packet is located in the last of the original segments and is before a last symbol therein; and cyclic redundancy check calculation unit configured to determine a remainder by performing a polynomial division on a second sequence of disjoint consecutive segments, each segment of the second sequence corresponding to and being derived from one of the original segments, the segments of the second sequence having the length of the original segments, the first of the derived segments of the second sequence being the modified first of the original segments, the last of the derived segments of the second sequence being the modified last of the original segments.

13. The system of claim 12, wherein the masking unit is configured to mask portions of the original segments outside of the data packet such that said portions will not contribute to the remainder determined by the polynomial division when a cyclic redundancy check of the data packet vanishes.

14. The system of claim 13, wherein the masking unit is configured to modify the first of the original segments by modifying symbols at the start of the data packet and to modify the last of the original segments by modifying symbols at the end of the data packet.

* * * * *